(12) United States Patent
Wu et al.

(10) Patent No.: US 9,748,105 B2
(45) Date of Patent: Aug. 29, 2017

(54) TUNGSTEN DEPOSITION WITH TUNGSTEN HEXAFLUORIDE (WF6) ETCHBACK

(71) Applicant: Applied Materials, Inc., Santa Clara, CA (US)

(72) Inventors: Kai Wu, Palo Alto, CA (US); Sang Ho Yu, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/337,908

(22) Filed: Jul. 22, 2014

(65) Prior Publication Data

US 2015/0050807 A1    Feb. 19, 2015

Related U.S. Application Data

(60) Provisional application No. 61/866,665, filed on Aug. 16, 2013.

(51) Int. Cl.
*H01L 21/285* (2006.01)
*H01L 21/768* (2006.01)
(Continued)

(52) U.S. Cl.
CPC ...... *H01L 21/28556* (2013.01); *C23C 16/045* (2013.01); *C23C 16/14* (2013.01); *H01L 21/76877* (2013.01); *H01L 21/32136* (2013.01)

(58) Field of Classification Search
CPC ......... H01L 21/02271; H01L 21/76877; H01L 21/76883; H01L 21/76879; H01L 21/28556; C23C 16/14
(Continued)

(56) References Cited

U.S. PATENT DOCUMENTS 5,186,718 A    2/1993  Tepman et al.
6,093,645 A    7/2000  Ameen et al.
(Continued)

FOREIGN PATENT DOCUMENTS

KR    10-2004-0087406 A    10/2004

OTHER PUBLICATIONS

International Search Report and Written Opinion for International Application No. PCT/US2014/047618 dated Nov. 5, 2014.

*Primary Examiner* — Thanhha Pham
(74) *Attorney, Agent, or Firm* — Patterson + Sheridan LLP

(57) ABSTRACT

Implementations described herein generally relate to methods for forming tungsten materials on substrates using vapor deposition processes. The method comprises positioning a substrate having a feature formed therein in a substrate processing chamber, depositing a first film of a bulk tungsten layer by introducing a continuous flow of a hydrogen containing gas and a tungsten halide compound to the processing chamber to deposit the first tungsten film over the feature, etching the first film of the bulk tungsten layer using a plasma treatment to remove a portion of the first film by exposing the first film to a continuous flow of the tungsten halide compound and an activated treatment gas and depositing a second film of the bulk tungsten layer by introducing a continuous flow of the hydrogen containing gas and the tungsten halide compound to the processing chamber to deposit the second tungsten film over the first tungsten film.

19 Claims, 7 Drawing Sheets

(51) Int. Cl.
  *H01L 21/321*     (2006.01)
  *C23C 16/14*      (2006.01)
  *C23C 16/04*      (2006.01)
  *H01L 21/3213*    (2006.01)

(58) Field of Classification Search
  USPC .................. 438/627–629, 672, 679, 685
  See application file for complete search history.

(56) References Cited

U.S. PATENT DOCUMENTS

| | | |
|---|---|---|
| 6,156,382 A | 12/2000 | Rajagopalan et al. |
| 6,878,206 B2 | 4/2005 | Tzu et al. |
| 2008/0311711 A1 | 12/2008 | Hampp et al. |
| 2009/0014879 A1 | 1/2009 | Park et al. |
| 2010/0144140 A1 | 6/2010 | Chandrashekar et al. |
| 2010/0167527 A1 | 7/2010 | Wu et al. |
| 2010/0240212 A1* | 9/2010 | Takahashi ............... 438/637 |
| 2012/0231626 A1 | 9/2012 | Lee et al. |
| 2013/0302980 A1* | 11/2013 | Chandrashekar et al. .... 438/666 |

* cited by examiner

TUNGSTEN DEPOSITION WITH TUNGSTEN HEXAFLUORIDE (WF6) ETCHBACK

CROSS-REFERENCE TO RELATED APPLICATIONS

This application claims benefit of U.S. provisional patent application Ser. No. 61/866,665, filed Aug. 16, 2013. The aforementioned related patent application is herein incorporated by reference in its entirety.

BACKGROUND

Field

Implementations described herein generally relate to the processing of substrates, and more particularly relate to methods for forming tungsten materials on substrates using vapor deposition processes.

Description of the Related Art

Reliably producing nanometer-sized features is one of the key technologies for the next generation of semiconductor devices. The shrinking dimensions of circuits and devices have placed additional demands on processing capabilities. The multilevel interconnects that lie at the heart of integrated circuit technology require precise processing of high aspect ratio features, such as vies and other interconnects. Reliable formation of these interconnects is very important to future success and to the continued effort to increase circuit density and quality of individual substrates.

Metallization of features formed on substrates includes CVD deposition of metals such as tungsten. Tungsten can be used for metal fill of source contacts, drain contacts, metal gate fill and gate contacts as well as applications in DRAM and flash memory. With technology node shrinkage, tungsten films having low resistivity and low roughness are desirable for device characteristics and for integration with subsequent processes.

Chemical vapor deposition (CVD) is one process technology used for metal fill of tungsten. A pattern is etched in the underlying interlayer dielectric (ILD) material 10. Tungsten is then processed to fill the etched substrates.

But successive reduction in feature sizes has meant that there is increasing difficulty in this process. When the tungsten layer is formed on the sidewalls as well as the bottom surface of the feature, the CVD process deposits the metal on both surfaces within the feature. With high aspect ratio features, as can be seen in Hal which shows the result of tungsten deposition growth during CVD, the opening (in new generation devices—where the nominal feature gap opening dimensions are in the range of 32 nm and less—(gap in the surface of the dielectric material layer created by the feature (or depression) therein can be 32 nm or less)) of the feature can become "closed off" 27 before the bottom up fill process reaches the full height of the thickness of the dielectric layer to fully fill the feature with substantially void-free tungsten fill material. The tungsten growth on the sidewalls tends to close off the feature at the feature opening before the lower portion of the feature has completely grown from the feature bottom surface resulting in a void 30 forming within the feature. The presence of the void 30 changes the material and operating characteristics of the interconnect feature and may eventually cause improper operation and premature breakdown of the device. The conductive element, line, to be efficient, carries near its practical maximum current density as established and known by persons skilled in the art in current state of the art devices. The goal is to achieve the same current flow density or higher in smaller features in future devices.

Therefore, it is desirable to use CVD for void-free filling of high aspect ratio ultra-small features with tungsten without the problems and limitations of conventional techniques discussed above.

SUMMARY

Implementations described herein generally relate to the processing of substrates, and more particularly relate to methods for forming tungsten materials on substrates using vapor deposition processes. In one implementation a method for depositing a tungsten film on a substrate is provided. The method comprises positioning a substrate having a feature formed therein in a substrate processing chamber, wherein the feature is defined by at least one sidewall and a bottom surface, depositing a first film of a bulk tungsten layer by introducing a continuous flow of a hydrogen containing gas and a tungsten halide compound to the processing chamber to deposit the first tungsten film over the feature, etching the first film of the bulk tungsten layer using a plasma treatment to remove a portion of the first film by exposing the first film to a continuous flow of the tungsten halide compound and an activated treatment gas and depositing a second film of the bulk tungsten layer by introducing a continuous flow of the hydrogen containing gas and the tungsten halide compound to the processing chamber to deposit the second tungsten film over the first tungsten film.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
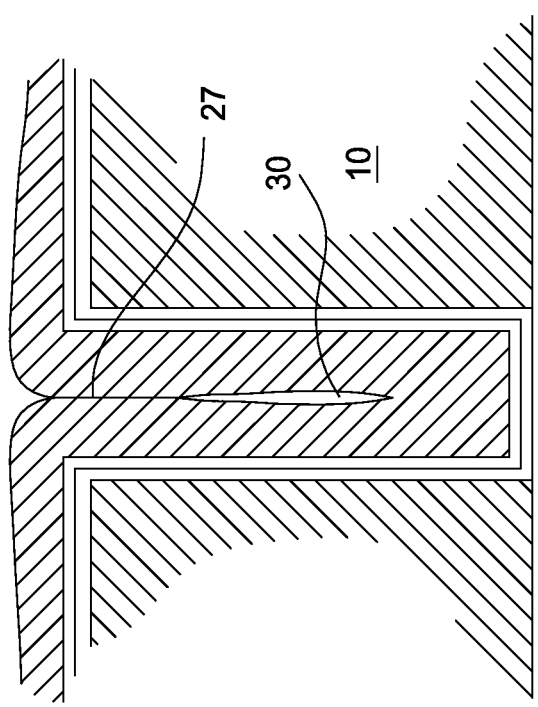
FIG. 1 (Prior Art) is a schematic cross-sectional views of a substrate with a feature having tungsten deposited therein using prior art processes.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Implementations described herein generally relate to the processing of substrates, and more particularly relate to methods for forming tungsten materials on substrates using vapor deposition processes.

Tungsten (W) has been used at contact level in logic application for about two decades. In recent advanced CMOS devices, new technology such as metal gate and FinFET emerge, which leads to a new application for tungsten as metal gate fill for both PMOS and NMOS devices. In 3D NAND devices, tungsten is also used for metal gate fill. The requirements for tungsten fill become more and more challenging. For contact, the overhang becomes more challenging as the dimensions of contacts are getting smaller and typically leaves a big seam after tungsten conformal fill. Furthermore, the seam will be exposed to slurry during WCMP, which causes integration issues. For metal gate trench in both advanced CMOS and 3D NAND, traditional tungsten conformal growth inevitably leaves a seam in the middle, which might be expanded wider during tungsten etch back process, causing device failure. Therefore, a seamless tungsten fill is desired for both contact and metal gate fill in the advanced logic and memory devices. This seamless tungsten fill can be achieved by tungsten deposition-etchback-deposition fill processes described herein. Normally tungsten etchback processes utilize $NF_3$ as the etchant in a dedicated etch chamber for better process control. The additional etch chamber makes tool configuration more complicated. Another major drawback of $NF_3$ etch is that $NF_3$ will poison the tungsten surface after etchback so that the second tungsten deposition process requires another tungsten nucleation layer leading to lower throughput and higher contact/line resistance.

In certain implementations described herein, tungsten etchback is achieved by using tungsten halide plasma (e.g., $WF_6$ plasma). The plasma source can be RF or a remote plasma source (RPS). Atomic fluorine is dissociated from $WF_6$ plasma and is used to etch metal tungsten. The etch rate is dependent on $WF_6$ flow and plasma condition. By adjusting the process conditions, a very mild etch rate in the range of ~0.5 Å/second to 3 Å/second can be achieved to control the etchback amount. With that, seamless fill can be produced on structures with different critical dimensions (CD) and overhang, and TiN liner attack by atomic fluorine can be avoided. Since there is no nitrogen in the etchant, there is no poisoning effect after $WF_6$ etchback. The second deposition process can utilize $WF_6+H_2$ chemistry directly without the need for a nucleation layer. Another big advantage is a single chamber deposition-etch-deposition process can be achieved since $WF_6$ may be used as both deposition precursor and etchant in one chamber. A standard WCVD chamber with RF or RPS plasma capability can perform both deposition and etchback, which provides improved throughput and chamber redundancy.

Figure 2:
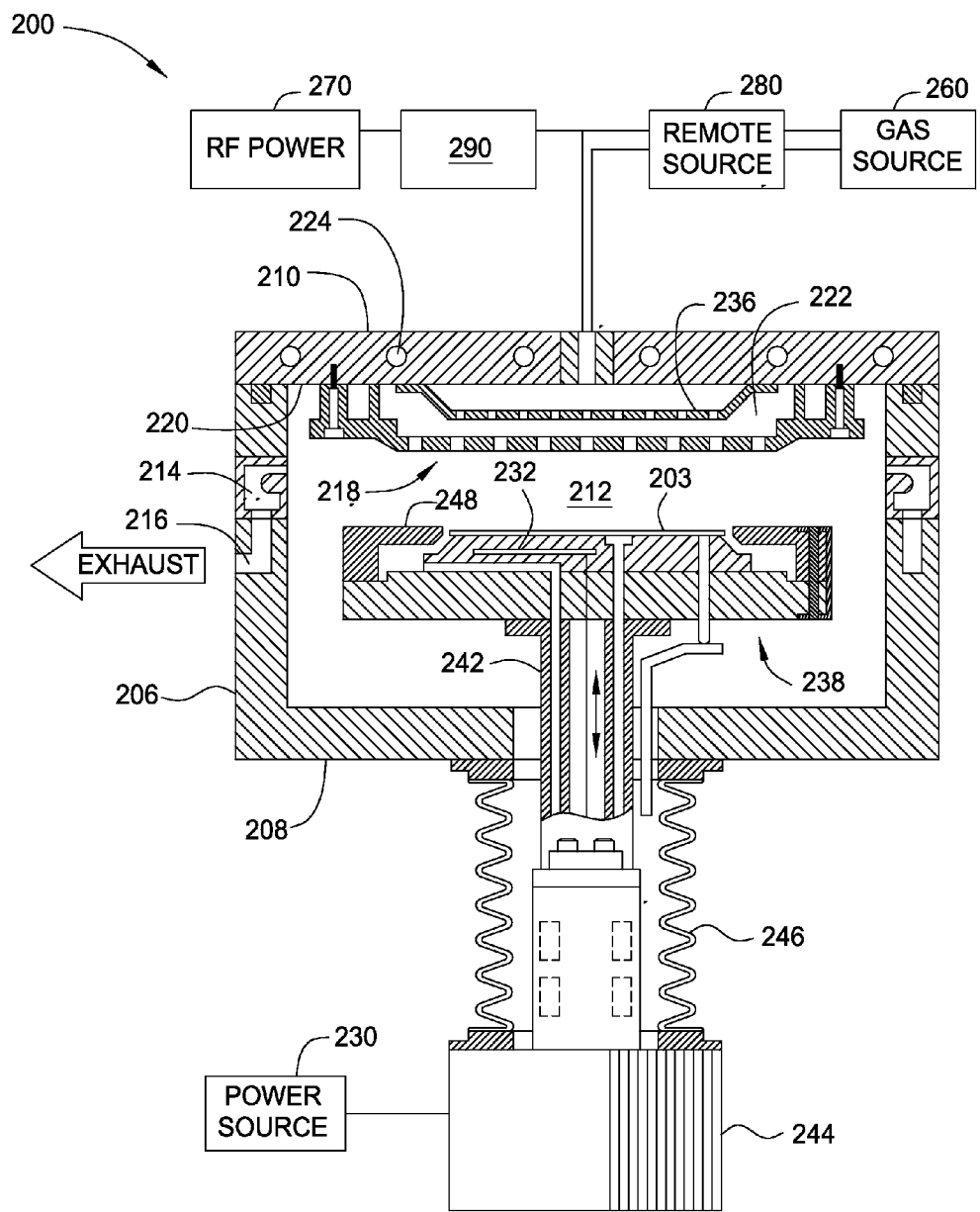
FIG. 2 is a schematic cross-sectional view of a plasma enhanced CVD (PECVD) processing chamber that may be used for depositing a tungsten layer according to implementations described herein.

FIG. 2 is a schematic cross-sectional view of a PECVD processing chamber 200 that may be used for depositing a tungsten layer according to the implementations described herein. Such a processing chamber 200 is available from Applied Materials, Inc. located in Santa Clara, Calif., and a brief description thereof follows. An integrated processing system capable of performing the nucleation and bulk layer deposition methods described herein is the tungsten chemical vapor deposition chamber, available from Applied Materials, Inc. located in Santa Clara, Calif. It is to be understood that the chamber described below is an exemplary implementation and other chambers, including chambers from other manufacturers may be used with or modified to match implementations of this disclosure without diverging from the inventive characteristics described herein.

Figure 5:
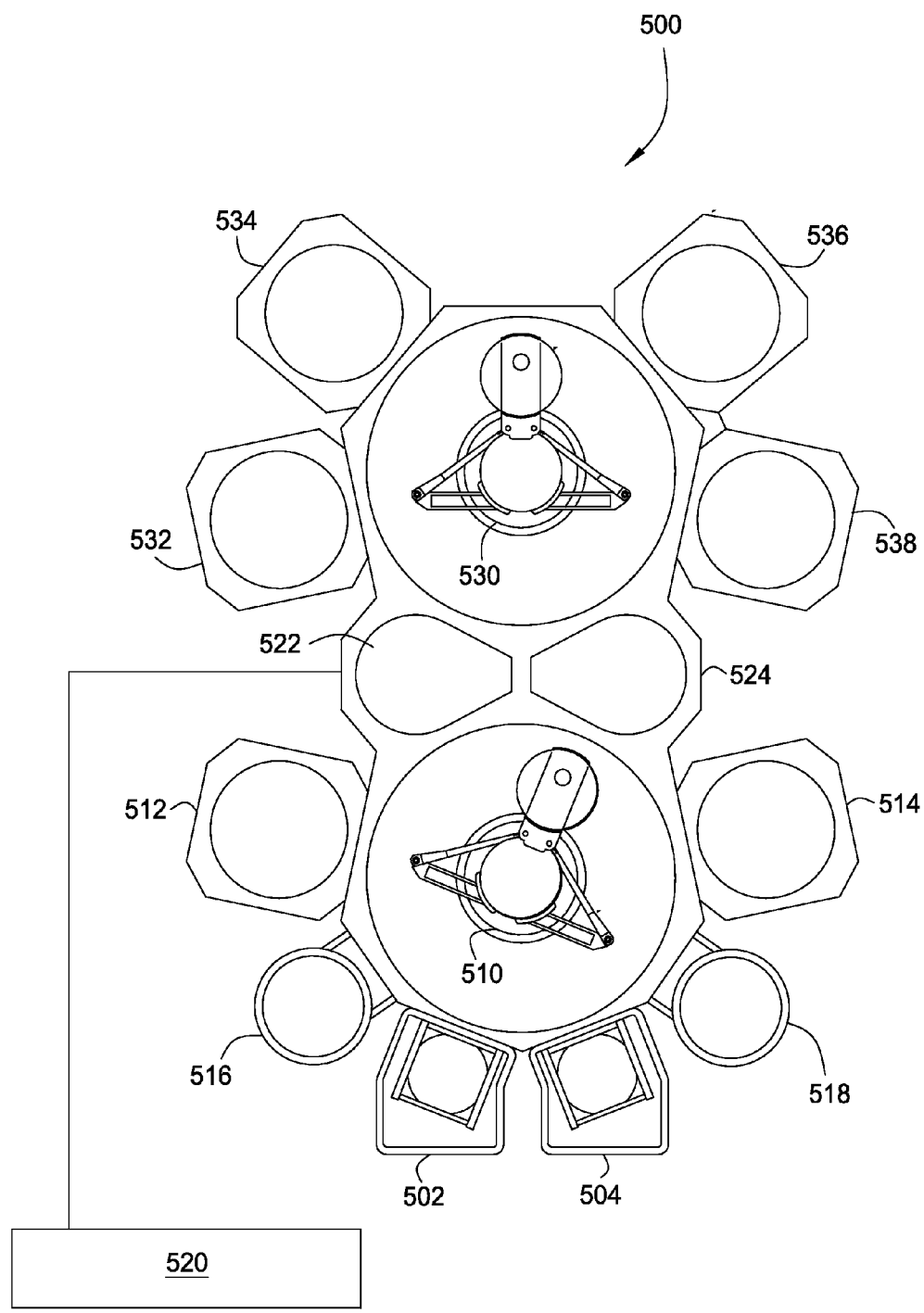
FIG. 5 is a schematic plan view of a duster tool that may be used for performing the implementations described herein.

The processing chamber 200 may be part of a processing system that includes multiple processing chambers connected to a central transfer chamber and serviced by a robot (see FIG. 5). The processing chamber 200 includes walls 206, a bottom 208, and a lid 210 that define a processing volume 212. The walls 206 and bottom 208 are typically fabricated from a unitary block of aluminum. The wads 206 may have conduits (not shown) therein through which a fluid may be passed to control the temperature of the walls 206. The processing chamber 200 may also include a pumping ring 214 that couples the processing volume 212 to an exhaust port 216 as well as other pumping components (not shown).

A substrate support assembly 238, which may be heated, may be centrally disposed within the processing chamber 200. The substrate support assembly 238 supports a substrate 203 during a deposition process. The substrate support assembly 238 generally is fabricated from aluminum, ceramic or a combination of aluminum and ceramic and typically includes a vacuum port (not shown) and at least one or more heating elements 232.

The vacuum port may be used to apply a vacuum between the substrate 203 and the substrate support assembly 238 to secure the substrate 203 to the substrate support assembly 238 during the deposition process. The one or more heating elements 232 may be, for example, electrodes disposed in the substrate support assembly 238, and coupled to a power source 230, to heat the substrate support assembly 238 and substrate 203 positioned thereon to a predetermined temperature.

Generally, the substrate support assembly 238 is coupled to a stem 242. The stem 242 provides a conduit for electrical leads, vacuum and gas supply lines between the substrate support assembly 238 and other components of the processing chamber 200. Additionally, the stem 242 couples the substrate support assembly 238 to a lift system 244 that moves the substrate support assembly 238 between an elevated position (as shown in FIG. 2) and a lowered position (not shown). Bellows 246 provides a vacuum seal between the processing volume 212 and the atmosphere outside the chamber 200 while facilitating the movement of the substrate support assembly 238.

The substrate support assembly 238 additionally supports a circumscribing shadow ring 248. The shadow ring 248 is annular in form and typically comprises a ceramic material such as, for example, aluminum nitride. Generally, the shadow ring 248 prevents deposition at the edge of the substrate 203 and substrate support assembly 238.

The lid 210 is supported by the walls 206 and may be removable to allow for servicing of the processing chamber 200. The lid 210 may generally be comprised of aluminum and may additionally have heat transfer fluid channels 224 formed therein. The heat transfer fluid channels 224 are coupled to a fluid source (not shown) that flows a heat transfer fluid through the lid 210. Fluid flowing through the heat transfer fluid channels 224 regulates the temperature of the lid 210.

A showerhead 218 may generally be coupled to an interior side 220 of the lid 210. A perforated blocker plate 236 may optionally be disposed in the space 222 between the showerhead 218 and lid 210. Gases (i.e., process and other gases) that enter the processing chamber 200 through the mixing block 234 are first diffused by the blocker plate 236 as the gases fill the space 222 behind the showerhead 218. The gases then pass through the showerhead 218 and into the processing chamber 200. The blocker plate 236 and the showerhead 218 are configured to provide a uniform flow of gases to the processing chamber 200. Uniform gas flow is desirable to promote uniform layer formation on the substrate 203.

A gas source 260 is coupled to the lid 210 to provide gas through gas passages in the showerhead 218 to a processing area between the showerhead 218 and the substrate 203. A vacuum pump (not shown) may be coupled to the processing chamber 200 to control the processing volume at a desired pressure. An RF source 270 is coupled through a match network 290 to the lid 210 and/or to the showerhead 218 to provide an RF current to the showerhead 218. The RF current creates an electric field between the showerhead 218 and the substrate support assembly 238 so that plasma may be generated from the gases between the showerhead 218 and the substrate support assembly 238.

A remote plasma source 280, such as an inductively coupled remote plasma source, may also be coupled between the gas source 260 and the lid 210. Between processing substrates, a cleaning gas may be provided to the remote plasma source 280 so that remote plasma is generated. The radicals from the remote plasma may be provided to the processing chamber for a plasma etching process. The etching gas may be further excited by the RF source 270 provided to the showerhead 218.

Figure 3:
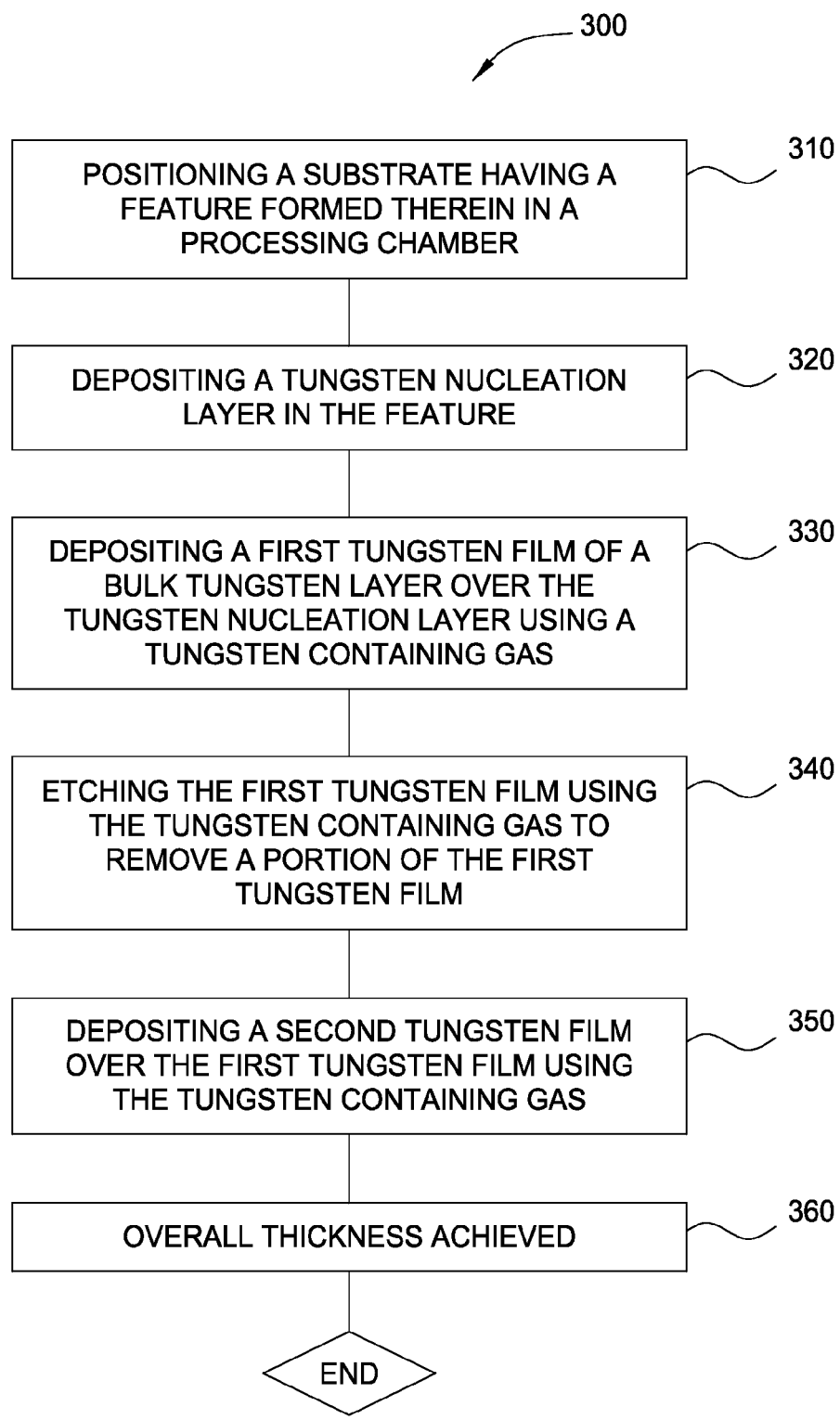
FIG. 3 is a flow diagram depicting a method for depositing a tungsten fill layer according to implementations described herein.

FIG. 3 is a flow diagram depicting a method 300 for depositing a tungsten fill layer according to implementations described herein. At block 310, a substrate having a feature formed therein is positioned in a processing chamber. At block 320, a tungsten nucleation layer is deposited in the feature. At block 330, a first tungsten film is deposited over the tungsten nucleation layer using a tungsten containing gas. At block 340, the first tungsten film is etched using the tungsten containing gas to remove a portion of the first tungsten film. At block 350, a second tungsten film is deposited over the first tungsten film using the tungsten containing gas. At block 360, it is determined whether the overall desired thickness of the tungsten layer is deposited. If the overall desired thickness has been achieved, the process ends. If the overall desired thickness has not been achieved the etch-deposition process may be repeated.

FIGS. 4A-4F are schematic cross-sectional views of a substrate at lapsed process periods, such as blocks 310-360 of process 300, according to implementations described herein. Process 300 is utilized to form tungsten metallization materials on a substrate surface. In one example, workpiece 400, depicted in FIGS. 4A-4F, may be fabricated or otherwise formed by process 300.

Figure 4B:
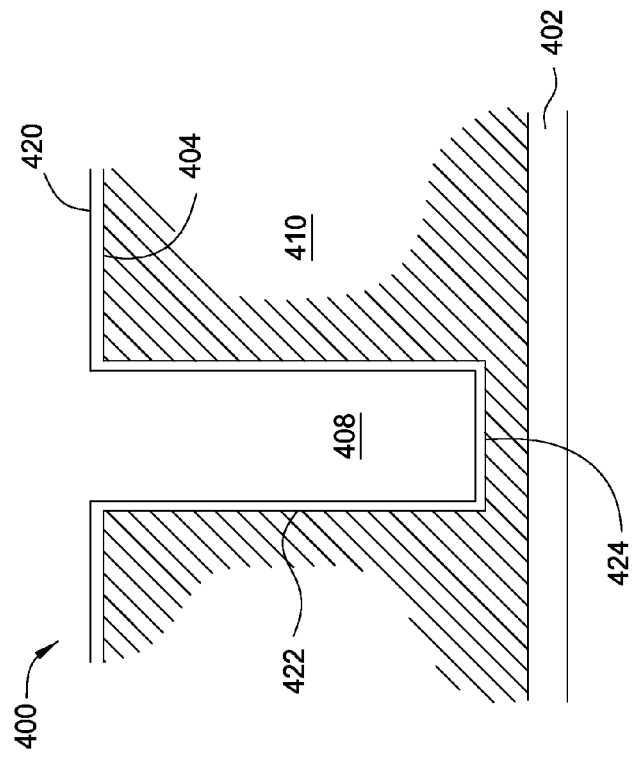
FIGS. 4A-4F are schematic cross-sectional views of a substrate with a feature having tungsten deposited therein according to implementations described herein.
Figure 4A:
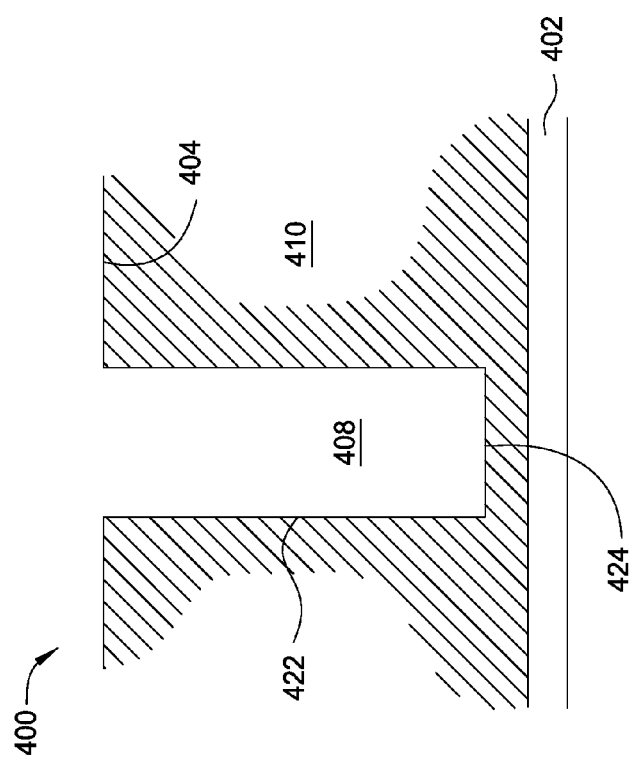

FIG. 4A depicts workpiece 400 that contains a dielectric layer 410 disposed on a substrate 402 and a feature 408 formed or otherwise contained within dielectric layer 410. The feature 408 has at least one sidewall 422 and a bottom surface 424. Exemplary features include features such as vias, trenches, lines, contact holes, or other features utilized in a semiconductor, solar, or other electronic devices, such as high aspect contact plugs. In some implementations where the feature is a via, the via may have a high aspect ratio (e.g., AR ~20-50). Generally, substrate 402 is a silicon substrate or at least contains silicon or a silicon-based material. In many examples, workpiece 400 is a semiconductor workpiece having a silicon substrate or wafer as substrate 402; dielectric layer 410 contains at least one dielectric material, such as silicon, monocrystalline silicon, microcrystalline silicon, polycrystalline silicon (polysilicon), amorphous silicon, hydrogenated amorphous silicon, silicon oxide materials, dopant derivatives thereof, or combinations thereof.

Upper surface 404 of workpiece 400 may have at least one or more contaminants disposed thereon. Contaminants disposed on upper surface 404 of workpiece 400 may include native oxides, residues, particles, and/or other contaminants. An optional process may be utilized to clean upper surface 404 of workpiece 400, in various implementations of process 300. For example, contaminants are removed from upper surface 404 of workpiece 400 during an optional process, such as a preclean process or a backside polishing process. FIG. 4A depicts upper surface 404 of workpiece 400 free of contaminants or substantially free of contaminants, including free of native oxides.

In some implementations, upper surface 404 of workpiece 400 may be exposed to a pre-clean process. Upper surface 404 usually contains silicon, polysilicon, or silicon containing surface (e.g., silicide) disposed thereon and may be exposed to pre-clean solution, vapor, or plasma during a pre-clean process. In one implementation, upper surface 404 is exposed to a reducing agent in gaseous form, such as silane, disilane, diborane, hydrogen, phosphine, or derivatives thereof. A carrier gas may be co-flowed with the reducing agent. Carrier gases include hydrogen, nitrogen, argon, or combinations thereof. In another implementation, upper surface 404 is exposed to a plasma pre-clean process. The plasma may be generated internal (e.g., in situ plasma) or generated externally (e.g., remote plasma system). Upper surface 404 may be exposed to a plasma formed from a gas or a gaseous mixture containing argon, helium, neon, hydrogen, nitrogen, ammonia, silane, disilane, diborane, or mixtures thereof. In several examples, the plasma may be formed from a hydrogen and ammonia mixture, a hydrogen and nitrogen mixture, or a nitrogen and ammonia mixture.

After the optional pre-clean process, an adhesion layer may be formed on the dielectric layer disposed on the substrate, as depicted in FIG. 4B. The adhesion layer 420 forms a relatively uniform layer of material on the planar upper surface 404 of the dielectric layer 410, the sidewalls 422 of the feature 408, and the bottom surface 424 of the feature 408. In some implementations, the adhesion layer 420 contains a metal or a metal nitride material, such as titanium, titanium nitride, alloys thereof, or combinations thereof. Exemplary materials for the adhesion layer 420 include Tantalum (Ta), Tungsten Nitride (WN), Titanium Nitride (TiN), $TiN_xSi_y$, Tantalum Nitride ($TaN_x$), Silicon Nitride (SiN), Tungsten (W), CoWP, NiMoP, NiMoB, Ruthenium (Ru), $RuO_2$, Molybdenum (Mo), $Mo_xN_y$, where x and y are non-zero numbers, and combinations thereof. Adhesion layer 420 may have a thickness within a range from about 2 Å to about 100 Å, more narrowly within a range from about 3 Å to about 80 Å, more narrowly within a range from about 4 Å to about 50 Å, more narrowly within a range from about 5 Å to about 25 Å, more narrowly within a range from about 5 Å to about 20 Å, more narrowly within a range from about 5 Å to about 15 Å, and more narrowly within a range from about 5 Å to about 10 Å. Adhesion layer 420 is generally deposited by chemical vapor deposition (CVD), atomic layer deposition (ALD) or physical vapor deposition (PVD) processes.

In block 320 of process 300, a nucleation layer 430 of desired thickness is deposited on adhesion layer 420, as depicted in FIG. 4O. The nucleation layer 430 may be a thin layer of tungsten which acts as a growth site for subsequent film. The nucleation layer 430 may be deposited by techniques such as atomic layer deposition (ALD), conventional chemical vapor deposition (CVD), or pulsed chemical vapor deposition (CVD). This process may be performed in a CVD processing chamber similar to that described above with reference to FIG. 2. The nucleation layer may be deposited in the same processing chamber used for the barrier layer soak process. The nucleation layer 430 may comprise tungsten, tungsten alloys, tungsten-containing materials (e.g., tungsten boride or tungsten silicide), and combinations thereof. The nucleation layer 430 may be deposited to a thickness in a range of about 10 angstroms to about 200 angstroms, or about 50 angstroms to about 150 angstroms. The nucleation layer may be deposited by flowing a tungsten containing gas (e.g., a tungsten halide compound such as $WF_6$) and a hydrogen containing gas (e.g., $H_2$, $B_2H_6$, or $SiH_4$) into a processing chamber, such as processing chamber 200 shown in FIG. 2. Processes for depositing a tungsten nucleation layer are further described in commonly assigned U.S. Pat. No. 7,405,158.

Figure 4D:
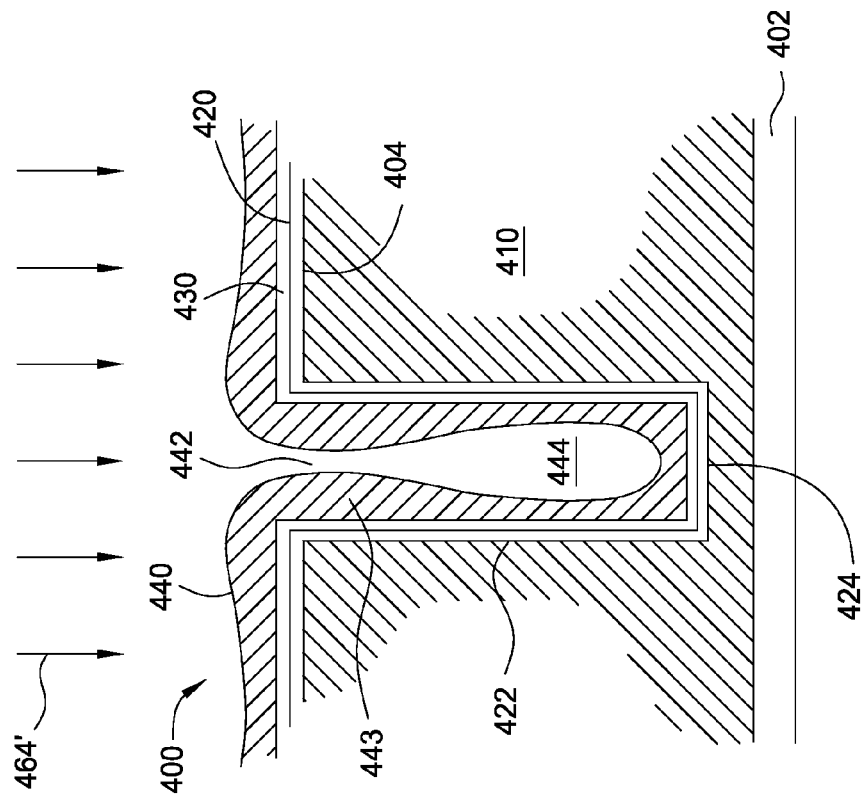
Figure 4C:
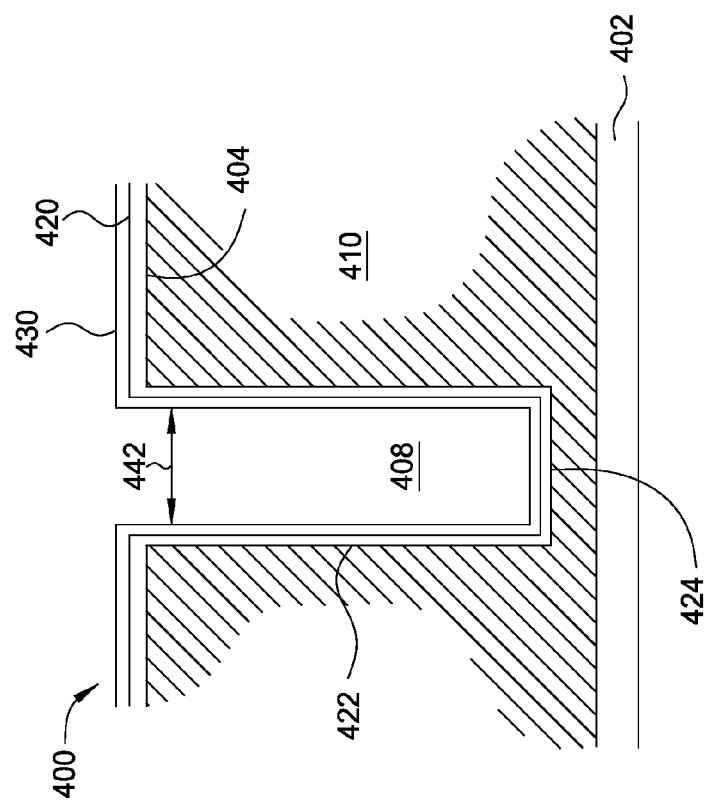

In block 330 of process 300, a first tungsten film 440 of a bulk tungsten layer 460 is deposited over the nucleation layer 430, as depicted in FIG. 4D. As depicted in FIG. 4D, the growth of the first tungsten film 440 along the sidewalls 422 of the feature 408 tends to close off the opening 442 of the feature before the lower portion of the feature 408 has completely grown from the bottom surface 424 of the feature 408 resulting in a void 444 forming within the feature 408.

In one implementation, the first tungsten film 440 may be deposited on or over nucleation layer 430. The first tungsten film 440 is generally formed over by thermal CVD, pulsed-CVD, PE-CVD, or pulsed PE-CVD. The processing chamber used to deposit the first tungsten film 440 may be processing chamber 200. The first tungsten film 440 may contain metallic tungsten, tungsten alloys, tungsten-containing materials (e.g., tungsten boride, tungsten silicide, or tungsten phosphide), or combinations thereof.

In one example, the first tungsten film 440 may be deposited on or over nucleation layer 430 on workpiece 400 which is simultaneously exposed to a tungsten containing gas (e.g., tungsten hexafluoride ($WF_6$)) and a hydrogen containing gas (e.g., hydrogen ($H_2$)) during a CVD process. Exemplary processes for soaking nucleation layer 430 and depositing the first tungsten film 440 thereon are further described in the commonly assigned U.S. Pat. No. 6,156,382.

The first tungsten film 440 may be deposited using the same processing gases, tungsten containing gas and hydrogen containing gases as were used to deposit the nucleation layer 430. The first tungsten film 440 may be formed in the same processing chamber as the nucleation layer 430, such as processing chamber 200.

In one implementation, following deposition of the nucleation layer 430 and any subsequent purging or post soak processes, the substrate may be positioned in a 300 mm processing chamber having a volume of about 13,560 cm³ and on a pedestal having a temperature in the range of about 100 C.° to about 600° C. (e.g., in the range of about 300° C. to 430° C.). In one example, the temperature may be about 400° C. Deposition of the first tungsten film 440 may be performed with the processing chamber at a pressure in the range of about 10 Torr to about 300 Torr (e.g., in the range of about 30 Torr to about 100 Torr). In one example, the pressure may be about 90 Torr. The reducing gas, for example, a hydrogen containing gas such as hydrogen gas ($H_2$), may be introduced at a continuous flow rate between 1,000 sccm and about 8,000 sccm, such as 5,000 sccm. The reducing gas can be introduced with a carrier gas, such as argon (Ar), at a flow rate in the range of about 0 sccm to about 20,000 sccm. In one example, argon may be introduced at a total flow rate of 11,000 sccm. A second flow of argon may be flowed through a purge guide (not shown in FIG. 2) at a rate from about 0 sccm to 2,000 sccm to prevent deposition gases from contacting the edge and backside of the substrate. In one example, the argon edge purge flow may be 500 sccm. Similarly, a second flow of hydrogen gas ($H_2$) may be flowed through a purge guide (not shown in FIG. 2) at a rate from about 0 sccm to 6,000 sccm. In one example, the hydrogen gas edge purge flow may be 2,500 sccm. In another implementation, an additional flow of carrier gas, such as argon, may be introduced as a bottom purge in order to prevent deposition on the backside of the chamber heating elements. In one example, the argon bottom purge flow may be 5,000 sccm. The tungsten-containing compound may be tungsten hexafluoride ($WF_6$) and may be introduced at a continuous flow rate in the range of about 50 sccm to 500 sccm, such as in the range of about 300 sccm to 400 sccm.

The first tungsten film 440 may be deposited at a deposition rate from about 100 Å/minute and about 1,200 Å/minute, for example, from about 500 Å/minute and about 800 Å/minute. The first tungsten film 440 may have a thickness within a range from about 10 Å to about 200 Å, and more narrowly within a range from about 20 Å to about 100 Å.

Figure 4E:
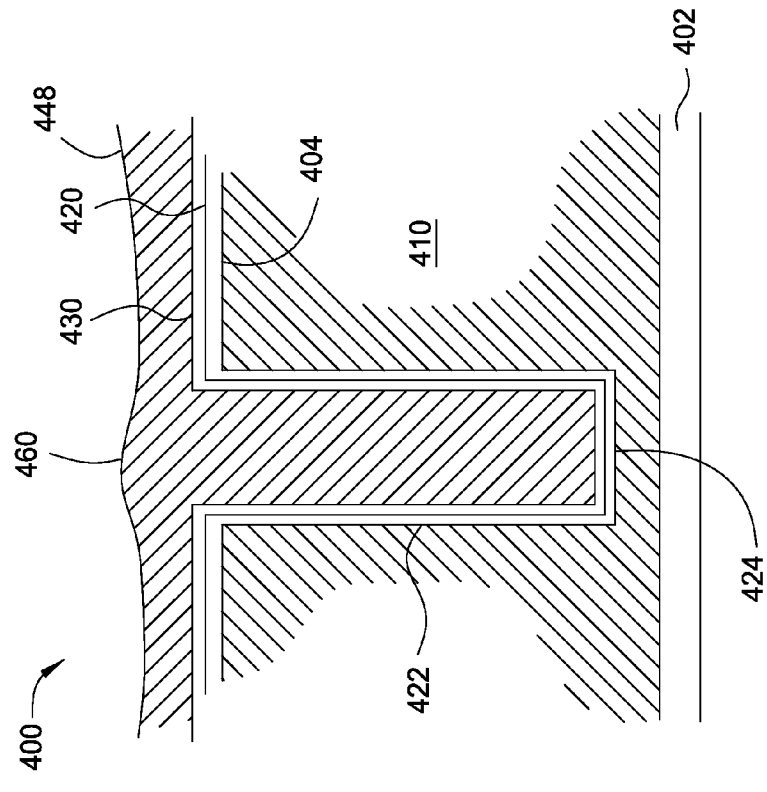

In block 340 of process 300, the first tungsten film 440 of the bulk tungsten layer 460 is etched using the tungsten containing gas to remove a portion of the first tungsten film 440, as depicted in FIGS. 4D and 4E. The etching process (also referred to as an etchback process) removes a portion of the first tungsten film 440 from along the sidewalls 422 of the feature 408 to clear a portion of the feature opening 442 for further deposition of tungsten material. The etching process may also be performed in the same processing chamber, such as processing chamber 200, as the tungsten deposition process of block 330. The etching process is generally performed using the same tungsten containing gases as used in block 330.

In one implementation, following deposition of the first tungsten film 440 and any subsequent purging or post soak processes, the first tungsten film 440 is etched using a plasma etching process. The plasma may be formed by coupling RF power to a treatment gas such as He, Ar, $O_2$, $N_2$, or combinations thereof. The plasma may be formed by a remote plasma source (RPS) and delivered to the processing chamber.

During the etch process, the pedestal may have a temperature in the range of about 100 C.° to about 600° C. (e.g., in the range of about 300° C. to 430° C.). In one example, the temperature may be about 400° C. Etching of the first tungsten film 440 may be performed with the processing chamber at a pressure in the range of about 0.1 Torr to about 5 Torr (e.g., in the range of about 0.5 Torr to about 2 Torr). In one example, the pressure may be about 1 Torr. The treatment gas (e.g., argon (Ar)) may be introduced at a flow rate in the range of about 100 scorn to about 3,000 sccm. In one example, argon may be introduced at a total flow rate of 2,000 sccm. A second flow of argon may be flowed through a purge guide (not shown in FIG. 2) at a rate from about 0 sccm to 2,000 sccm to prevent deposition gases from contacting the edge and backside of the substrate. In one example, the argon edge purge flow may be 500 sccm. Similarly, a second flow of hydrogen gas ($H_2$) may be flowed through a purge guide (not shown in FIG. 2) at a rate from about 0 sccm to 6,000 sccm. In one example, the hydrogen gas edge purge flow may be 2,500 sccm. In another implementation, an additional flow of treatment gas, such as argon, may be introduced as a bottom purge in order to prevent deposition on the backside of the chamber heating elements. In one example, the argon bottom purge flow may be 5,000 sccm. The tungsten-containing compound may be tungsten hexafluoride ($WF_6$) and may be introduced at a continuous flow rate in the range of about 1 sccm to 150 sccm, such as in the range of about 3 sccm to 100 sccm.

The arrows 464' represent the direction of atomic fluorine during the etch process causes the atomic fluorine to collide with the top (planar) surface of the first tungsten film 440.

In implementations where the plasma is formed by coupling RF power to the treatment gas, an RF power between 50 W and 100 W, such as 75 W at an RF power frequency from about 10 MHz to about 30 MHZ, for example, about 13.56 MHz, may be used.

In implementations where the plasma is formed in a remote plasma source (RPS) the power application may be from about 1,000 Watts to about 6,000 Watts, for example, from about 1,000 Watts to about 2,000 Watts, with a treatment gas flow rate (e.g., argon) from about 500 sccm to about 6,000 sccm.

Portions of the first tungsten film 440 may be removed at an etch rate from about 0.1 Å/second to about 10 Å/second, for example, from about 0.5 Å/second to about 3 Å/second. The processing conditions for the etchback process are typically selected such that the overhang portion 443 of the first tungsten film 440 is removed from the first tungsten film 440.

Figure 4F:
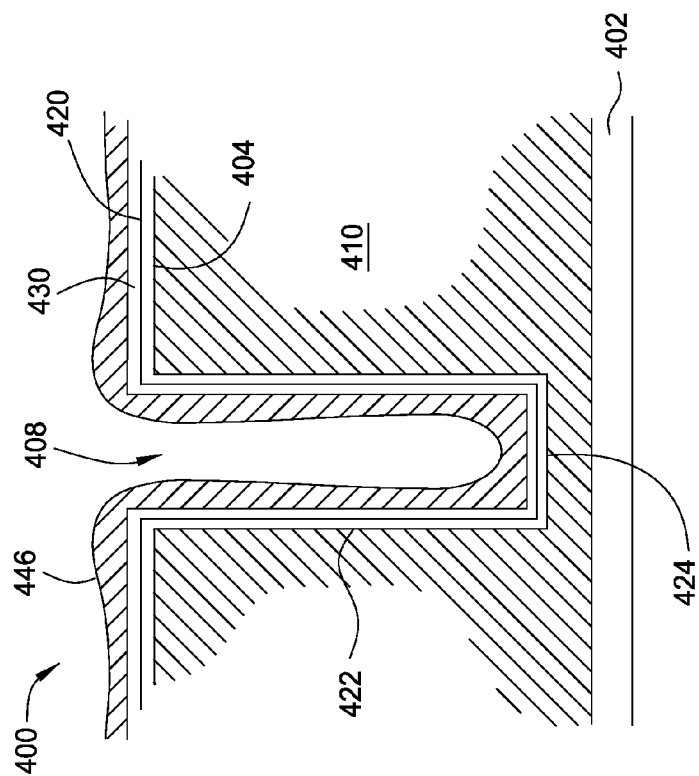

In block 350 of process 300, a second tungsten film 448 of the bulk tungsten layer 460 is deposited over the remaining first tungsten film 446 after etching of the first tungsten film 440, as depicted in FIG. 4F. The second tungsten film 448 of the bulk tungsten layer 460 may be deposited in the same processing chamber as the deposition process of block 330 and the etching process of block 340, such as processing chamber 200. The second tungsten film 448 of the bulk tungsten layer 460 may be deposited using the same tungsten containing gases as used in block 330 and block 340.

In one implementation, following etching of the first tungsten film 440, deposition of a second tungsten film 448 of the bulk tungsten layer 460 is performed. The second tungsten film 448 of the bulk tungsten layer 460 may be performed on a pedestal having a temperature in the range of about 100 C.° to about 600° C. (e.g., in the range of about 300° C. to about 430° C.). In one example, the temperature may be about 400° C. Deposition of the second tungsten film 448 of the bulk tungsten layer 460 may be performed with the processing chamber at a pressure in the range of about 10 Torr to about 300 Torr (e.g., in the range of about 30 Torr to about 100 Torr). In one example, the pressure may be about 90 Torr. The reducing gas, for example, hydrogen gas ($H_2$), may be introduced at a continuous flow rate between 1,000 sccm and about 8,000 sccm, such as 5,000 sccm. The reducing gas can be introduced with a carrier gas, such as argon (Ar), at a flow rate in the range of about 0 sccm to about 20,000 sccm. In one example, argon may be introduced at a total flow rate of 11,000 sccm. A second flow of argon may be flowed through a purge guide (not shown in FIG. 2) at a rate from about 0 sccm to 2,000 sccm to prevent deposition gases from contacting the edge and backside of the substrate. In one example, the argon edge purge flow may be 500 sccm. Similarly, a second flow of hydrogen gas ($H_2$) may be flowed through a purge guide (not shown in FIG. 2) at a rate from about 0 sccm to 6,000 sccm. In one example, the hydrogen gas edge purge flow may be 2,500 sccm. In another implementation, an additional flow of carrier gas, such as argon, may be introduced as a bottom purge in order to prevent deposition on the backside of the chamber heating elements. In one example, the argon bottom purge flow may be 5,000 sccm. The tungsten-containing compound may be tungsten hexafluoride ($WF_6$) and may be introduced at a continuous flow rate in the range of about 50 sccm to 500 sccm, such as in the range of about 300 sccm to 400 sccm.

The second tungsten film 448 of the bulk tungsten first tungsten layer 440 may be deposited at a deposition rate from about 1,200 Å/minute and about 3,000 Å/minute. The second tungsten film 448 of the bulk tungsten first tungsten layer 440 may be deposited at a deposition rate from about 1,800 Å/minute and about 2,300 Å/minute.

In block 360 of process 300 it is determined whether the overall desired thickness of the bulk tungsten layer 460 has been achieved. If the desired thickness of bulk tungsten layer 460 has been achieved, the process 300 ends. If the desired thickness of the bulk tungsten layer 460 has not been achieved any of the aforementioned deposition and etching processes may be performed again. The determination of the thickness of the of the tungsten bulk layer may be performed using conventional processes such as, for example, spectroscopic measurements.

Process Integration

A tungsten-containing layer and barrier layer as described above has shown particular utility when integrated with traditional nucleation fill techniques to form features with excellent film properties. An integration scheme can include ALD, CVD, pulsed-CVD processes, plasma-enhanced CVD, or pulsed PE-CVD, to deposit tungsten-containing layers and barrier layers while a nucleation layer may be deposited by ALD process. Integrated processing systems capable of performing such an integration scheme include ENDURA®, ENDURA SL®, CENTURA®, or PRODUCER® processing systems, each available from Applied Materials, Inc., located in Santa Clara, Calif. Any of these systems may be configured to include at least one ALD chamber for depositing the tungsten-containing layer and barrier layer, at least one ALD or pulsed-CVD chamber for depositing the nucleation layer, at least one CVD chamber for depositing bulk fill, and/or at least one PVD chamber for additional materials. In one implementation, one ALD or CVD chamber may be configured to perform all vapor deposition processes related to the tungsten-containing layers.

FIG. 5 is a schematic plan view of a cluster tool 500 that may be used for performing the implementations described herein. A similar multi-chamber processing system is disclosed in commonly assigned U.S. Pat. No. 5,186,718. Processing system 500 generally includes load lock chambers 502 and 504 for the transfer of substrates into and out from processing system 500. Typically, since processing system 500 is under vacuum, load lock chambers 502 and 504 may "pump down" the substrates introduced into processing system 500. First robot 510 may transfer the substrates between load lock chambers 502 and 504, and a first set of one or more substrate processing chambers 512, 514, 516, and 518 (four are shown). Each processing chamber 512, 514, 516, and 518, may be outfitted to perform a number of substrate processing operations such as ALD, CVD, PVD, etch, pre-clean, de-gas, orientation, or other substrate processes. First robot 510 also transfers substrates to/from one or more transfer chambers 522 and 524.

Transfer chambers 522 and 524 are used to maintain ultra-high vacuum conditions while allowing substrates to be transferred within processing system 500. Second robot 530 may transfer the substrates between transfer chambers 522 and 524 and a second set of one or more processing chambers 532, 534, 536, and 538. Similar to processing chambers 512, 514, 516, and 518, processing chambers 532, 534, 536, and 538 may be outfitted to perform a variety of substrate processing operations, such as ALD, CVD, PVD, etch, pre-clean, de-gas, or orientation. Any of processing chambers 512, 514, 516, 518, 532, 534, 536, and 538 may be removed from processing system 500 if not necessary for a particular process to be performed by processing system 500. Microprocessor controller 520 may be used to operate all aspects of processing system 500.

In one arrangement, each processing chamber 532 and 538 may be an ALD chamber or other vapor deposition chamber adapted to deposit sequential layers containing different chemical compound. For example, the sequential layers may include a layer, a barrier layer, and a nucleation layer. Processing chambers 534 and 536 may be an ALD chamber, a CVD chamber, or a PVD adapted to form a bulk layer. Processing chambers 512 and 514 may be a PVD chamber, a CVD chamber, or an ALD chamber adapted to deposit a dielectric layer. Also, processing chambers 516 and 518 may be an etch chamber outfitted to etch features or openings for interconnect features. This one particular arrangement of processing system 500 is provided to illustrate some implementations of the disclosure and should not be used to limit the scope of other implementations of the disclosure.

In another integration scheme, one or more ALD chambers are integrated onto a first processing system while one or more bulk layer deposition chambers are integrated onto a second processing system. In this configuration, substrates are first processed in the first system where a layer, a barrier layer and a nucleation layer is deposited on a substrate sequentially. Thereafter, the substrates are moved to the second processing system where bulk deposition occurs.

In yet another integrated system, a system may include nucleation deposition as well as bulk fill deposition in a single chamber. A chamber configured to operate in both an ALD mode as well as a conventional CVD mode may be used in processes described herein. One example of such a chamber is described in commonly assigned U.S. Pat. No. 6,878,206.

In certain implementations using the deposition-etch-deposition process with $WF_5$ described herein, seamless gap-fill was achieved with a single chamber solution.

While the foregoing is directed to implementations of the present disclosure, other and further implementations of the disclosure may be devised without departing from the basic scope thereof, and the scope thereof is determined by the claims that follow.

The invention claimed is:

1. A method for depositing a tungsten film on a substrate, comprising:
   positioning a substrate having a feature formed therein in a substrate processing chamber, wherein the feature is defined by at least one sidewall and a bottom surface;
   depositing a first tungsten film of a bulk tungsten layer by introducing a continuous flow of a hydrogen containing gas and a tungsten halide compound to the processing chamber to deposit the first tungsten film over the feature while maintaining the processing chamber at a first pressure and a first temperature of between about 300 degrees Celsius and about 430 degrees Celsius;
   etching the first tungsten film of the bulk tungsten layer in the processing chamber using a plasma treatment to remove a portion of the first tungsten film by exposing the first tungsten film to a continuous flow of the tungsten halide compound and an activated treatment gas while maintaining the processing chamber at a second pressure less than the first pressure and a second temperature of between about 300 degrees Celsius and about 430 degrees Celsius, wherein the activated treatment gas comprises activated helium gas, activated argon gas, activated oxygen gas, or activated nitrogen gas; and
   depositing a second tungsten film of the bulk tungsten layer by introducing a continuous flow of the hydrogen containing gas and the tungsten halide compound to the processing chamber to deposit the second tungsten film over the first tungsten film.

2. The method of claim 1, wherein the tungsten halide compound is selected from the group consisting of: tungsten hexafluoride ($WF_6$) and tungsten hexachloride ($WCl_6$).

3. The method of claim 2, wherein the hydrogen containing gas is hydrogen ($H_2$).

4. The method of claim 3, wherein the activated treatment gas is activated argon gas.

5. The method of claim 4, wherein the activated treatment gas is formed in-situ in the substrate processing chamber.

6. The method of claim 4, wherein the activated treatment gas is formed using a remote plasma source.

7. The method of claim 6, wherein the feature is formed in and below a surface of a dielectric layer formed on the substrate.

8. The method of claim 1, wherein an adhesion layer is formed over the at least one sidewall and the bottom surface of the feature.

9. The method of claim 8, wherein a nucleation layer is formed over the adhesion layer.

10. The method of claim 1, wherein the first tungsten film and the second tungsten film are deposited using a thermal chemical vapor deposition (CVD) process.

11. The method of claim 1, wherein a nominal minimal dimension across a gap in the surface of the substrate created by the feature is 32 nm or less.

12. The method of claim 1, wherein the feature is a high aspect ratio feature selected from the group consisting of a contact, a via, a trench and a line.

13. A method for depositing a tungsten film on a substrate, comprising:
   positioning a substrate having a feature formed therein in a substrate processing chamber, wherein the feature is defined by at least one sidewall and a bottom surface;
   depositing a first tungsten film of a bulk tungsten layer by introducing a continuous flow of a hydrogen containing gas and a tungsten halide compound to the processing chamber to deposit the first tungsten film over the feature while maintaining the processing chamber at a first pressure and a first temperature of between about 300 degrees Celsius and about 430 degrees Celsius;
   etching the first tungsten film of the bulk tungsten layer in the processing chamber using a plasma treatment to remove a portion of the first tungsten film by exposing the first tungsten film to a continuous flow of the tungsten halide compound and an activated treatment gas while maintaining the processing chamber at a second pressure less than the first pressure and a second temperature of between about 300 degrees Celsius and about 430 degrees Celsius, wherein the activated treatment gas comprises activated helium gas, activated argon gas, activated oxygen gas, or activated nitrogen gas; and
   depositing a second tungsten film of the bulk tungsten layer by introducing a continuous flow of the hydrogen containing gas and the tungsten halide compound to the processing chamber to deposit the second tungsten film over the first tungsten film, wherein the portion of the first tungsten film is removed at an etch rate in a range from about 0.5 Å/second and about 3 Å/second.

14. The method of claim 13, wherein the tungsten halide compound is selected from the group consisting of: tungsten hexafluoride ($WF_6$) and tungsten hexachloride ($WCl_6$).

15. The method of claim 14, wherein the hydrogen containing gas is hydrogen ($H_2$).

16. The method of claim 15, wherein the activated treatment gas is activated argon gas.

17. The method of claim 16, wherein the activated treatment gas is formed in-situ in the substrate processing chamber.

18. The method of claim 17, wherein the activated treatment gas is formed using a remote plasma source.

19. The method of claim 13, wherein the feature is formed in and below a surface of a dielectric layer formed on the substrate.

\* \* \* \* \*